United States Patent
Akahori et al.

(10) Patent No.: US 9,887,012 B2
(45) Date of Patent: Feb. 6, 2018

(54) WRITE VOLTAGE GENERATION CIRCUIT AND MEMORY APPARATUS

(71) Applicant: LAPIS Semiconductor Co., Ltd., Yokohama (JP)

(72) Inventors: Akira Akahori, Yokohama (JP); Katsuaki Matsui, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 15/142,988

(22) Filed: Apr. 29, 2016

(65) Prior Publication Data
US 2016/0322086 A1 Nov. 3, 2016

(30) Foreign Application Priority Data

May 1, 2015 (JP) .................................. 2015-094334

(51) Int. Cl.
| | | |
|---|---|---|
| *G11C 5/14* | (2006.01) | |
| *G11C 17/12* | (2006.01) | |
| *G11C 17/18* | (2006.01) | |

(52) U.S. Cl.
CPC ............ *G11C 17/123* (2013.01); *G11C 5/145* (2013.01); *G11C 17/18* (2013.01)

(58) Field of Classification Search
CPC ........ G11C 17/123; G11C 5/145; G11C 17/18
See application file for complete search history.

(56) References Cited

U.S. PATENT DOCUMENTS

| | | | | |
|---|---|---|---|---|
| 5,631,867 A | * | 5/1997 | Akamatsu | G11C 5/145 327/143 |
| 5,642,309 A | * | 6/1997 | Kim | G11C 16/10 365/185.2 |
| 5,708,387 A | * | 1/1998 | Cleveland | G11C 5/145 327/536 |
| 2005/0078506 A1 | * | 4/2005 | Rao | G11C 11/4094 365/154 |
| 2008/0123426 A1 | * | 5/2008 | Lutze | G11C 16/3418 365/185.17 |
| 2011/0194352 A1 | * | 8/2011 | Zhao | G11C 16/0483 365/185.19 |
| 2011/0249506 A1 | * | 10/2011 | Umezawa | G11C 16/14 365/185.19 |
| 2014/0241058 A1 | * | 8/2014 | Yoshida | G11C 16/10 365/185.03 |

FOREIGN PATENT DOCUMENTS

JP     2008-017567 A     1/2008

* cited by examiner

*Primary Examiner* — Douglas King
(74) *Attorney, Agent, or Firm* — Rabin & Berdo, P.C.

(57) ABSTRACT

A write voltage generation circuit includes: a power supply terminal that receives an external power supply voltage; a boosting circuit that boosts the external power supply voltage to generate a boosted voltage; and a selector that selects either one of the external power supply voltage and the boosted voltage, and outputs the selected voltage as the write voltage. The selector selects the external power supply voltage as the write voltage in a first part of a write period for writing data to a memory cell, and selects the boosted voltage as the write voltage in a latter part of the write period.

6 Claims, 5 Drawing Sheets

WRITE VOLTAGE GENERATION CIRCUIT AND MEMORY APPARATUS

BACKGROUND OF THE INVENTION

1. Field of the Invention

The present invention relates to a write voltage generation circuit for generating a write voltage to be applied to a memory cell, and a memory apparatus including the write voltage generation circuit.

2. Description of the Related Art

Nonvolatile memories need a high voltage (several volts to 20 volts) as a write voltage for writing data. Nonvolatile memories then generate the write voltage to be applied to memory cells by boosting a relatively-low power supply voltage supplied from outside by using a boosting circuit such as a charge pump circuit (for example, Japanese Patent Application Laid-Open No. 2008-17567).

SUMMARY OF THE INVENTION

To perform high-speed writing to a memory cell, or a memory cell in which no charge is stored in particular, a high current supply capability is required of the boosting circuit.

There has been a problem that if the boosting circuit is configured as a high current output type, the chip occupation area of the boosting circuit increases and the entire write voltage generation circuit becomes larger.

An object of the present invention is to provide a write voltage generation circuit and a memory apparatus which enable the writing of data to a memory cell at high speed without increasing the scale of the apparatus.

A write voltage generation circuit according to the present invention is a write voltage generation circuit for generating a write voltage to be applied to a memory cell thereby causing said memory cell to memorize data, the write voltage generation circuit including: a power supply terminal for receiving an external power supply voltage; a boosting circuit for boosting the external power supply voltage to generate a boosted voltage; and a selector for selecting either one of the external power supply voltage and the boosted voltage, and outputting the selected voltage as the write voltage, wherein the selector selects the external power supply voltage as the write voltage in a first part of a write period for writing data to the memory cell, and selects the boosted voltage as the write voltage in a latter part of the write period.

A memory apparatus according to the present invention is a memory apparatus for writing data by applying a write voltage to a memory cell thereby causing said memory cell to memorize data, the memory apparatus including: a power supply terminal for receiving an external power supply voltage; a boosting circuit for boosting the external power supply voltage to generate a boosted voltage; and a write driving unit for applying the external power supply voltage to the memory cell as the write voltage in a first part of a write period for writing data, and applying the boosted voltage to the memory cell as the write voltage in a latter part of the write period.

In the present invention, the external power supply voltage supplied from an external power supply capable of supplying a relatively high current is applied to the memory cell as the write voltage in the first part of the write period in which the amount of charge stored in the memory cell is small. A charge is thereby quickly injected into the memory cell. As a result, a desired amount of charge is stored into the memory cell in the first part of the write period. In the latter part of the write period, the boosted voltage obtained by boosting the external power supply voltage is applied to the memory cell as the write voltage instead of the external power supply voltage. Consequently, a boosting circuit of low current output type having low current supply capability can be employed. This reduces the chip occupation area of the boosting circuit.

According to the present invention, writing can be performed at high speed without increasing the scale of the apparatus.

BRIEF DESCRIPTION OF THE DRAWINGS

Features of the present invention will be described in the following description with reference to the accompanying drawings, in which.

DETAILED DESCRIPTION OF THE INVENTION

Hereinafter, an embodiment of the present invention will be described in detail with reference to the drawings.

Figure 1:
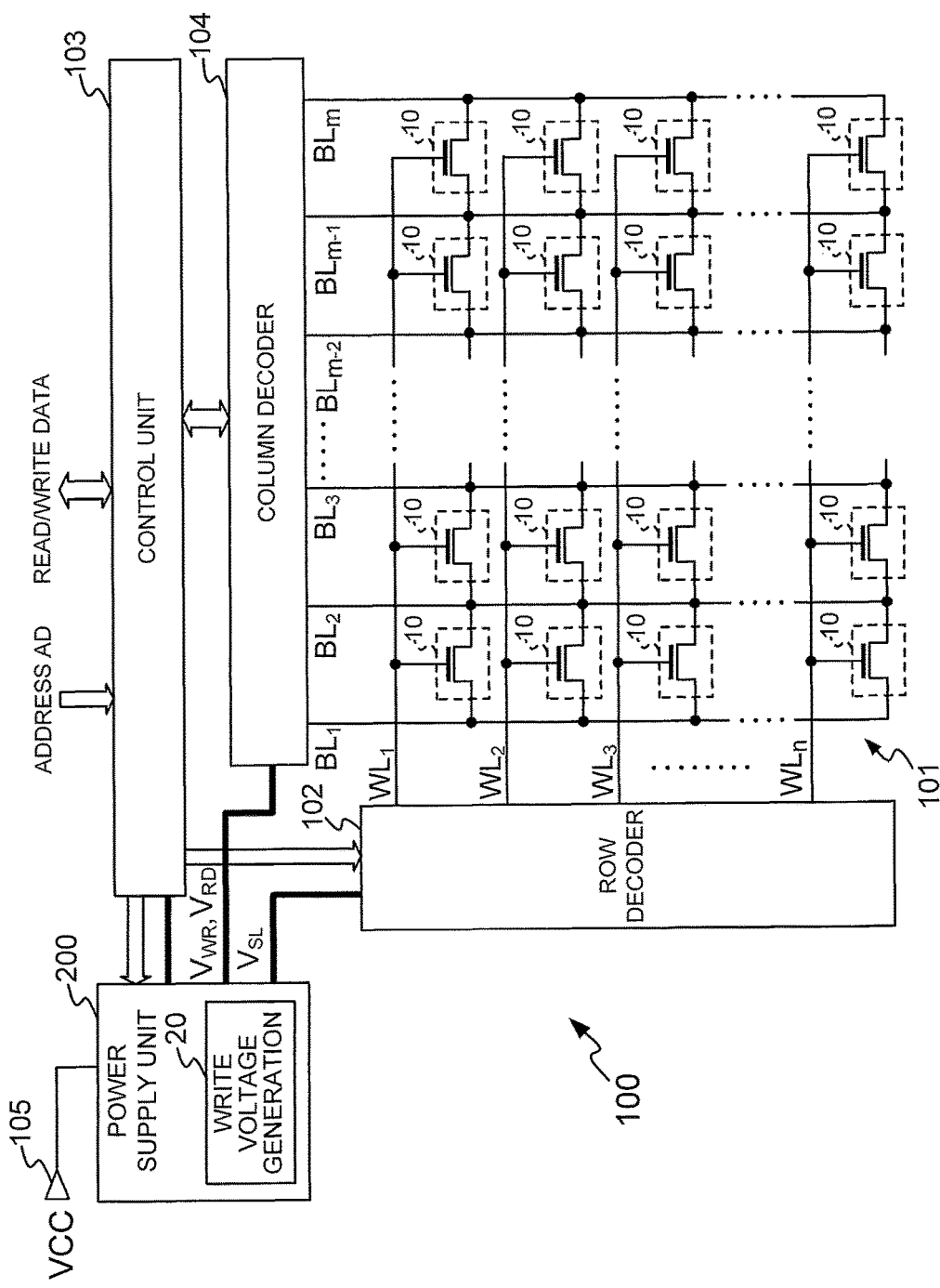
FIG. 1 is a block diagram showing a schematic configuration of a semiconductor memory 100 including a write voltage generation circuit 20 according to the present invention.

FIG. 1 is block diagram showing a schematic configuration of a semiconductor memory 100 including a write voltage generation circuit according to the present invention.

In FIG. 1, a memory cell array 101 includes a plurality of bit lines $BL_1$ to $BL_m$ (m is an integer of 2 or more) arranged in a column direction, and a plurality of word lines $WL_1$ to $WL_n$ (n is an integer of 2 or more) arranged in a row direction to intersect the bit lines $BL_1$ to $BL_m$. Memory cells 10 are arranged at respective intersections of the bit lines BL and the word lines WL.

For example, the memory cells 10 each include an n-channel MOSFET (Metal-Oxide-Semiconductor Field-Effect Transistor). In each memory cell 10, the drain terminal and the source terminal of the MOSFET are connected to respective adjoining bit lines BL.

With such a configuration, each memory cell 10 writes and reads binary or multivalued data according to a voltage applied to its gate terminal via a word line WL and voltages applied to the the drain and source terminals via a pair of bit lines BL, respectively.

A row decoder 102 applies a selection voltage $V_{SL}$ to the word lines $WL_1$ to $WL_n$ of the memory cell array 101 on the basis of control signals supplied from a control unit 103.

A column decoder 104 applies a ground potential, a read voltage $V_{RD}$, or a write voltage $V_{WR}$ to the bit lines $BL_1$ to $BL_m$ of the memory cell array 101 on the basis of control signals supplied from the control unit 103. The write voltage $V_{WR}$ causes the memory cell memorize data.

During a data read, the control unit 103 supplies the row decoder 102 with a control signal for applying the selection signal $V_{SL}$ to a word line corresponding to an address indicated by an address AD. In the meantime, the control unit 103 supplies the column decoder 104 with a control signal for applying the ground potential or the read voltage $V_{RD}$ to the bit lines $BL_1$ to $BL_m$ (read control). By the read control, the column cells 10 transmit currents according to charges stored therein to the bit lines BL. Here, the column decoder 104 supplies read current values indicating the current values transmitted to the bit lines BL to the control unit 103. The control unit 103 determines the value of data on the basis of the read current values, and outputs read data indicating the value.

During a data write, the control unit 103 performs the following verify write control according to write data supplied from outside.

The control unit 103 supplies the row decoder 102 with the control signal for applying the selection voltage $V_{SL}$ to a word line WL corresponding to the address indicated by the address AD. In the meantime, as shown in FIG. 2, the control unit 103 generates a write signal WR including a pulse train for repeatedly applying the write voltage $V_{WR}$ to one address indicated by the address AD, and supplies the write signal WR to the column decoder 104 and a power supply unit 200 while repeating the foregoing read control.

Figure 2:
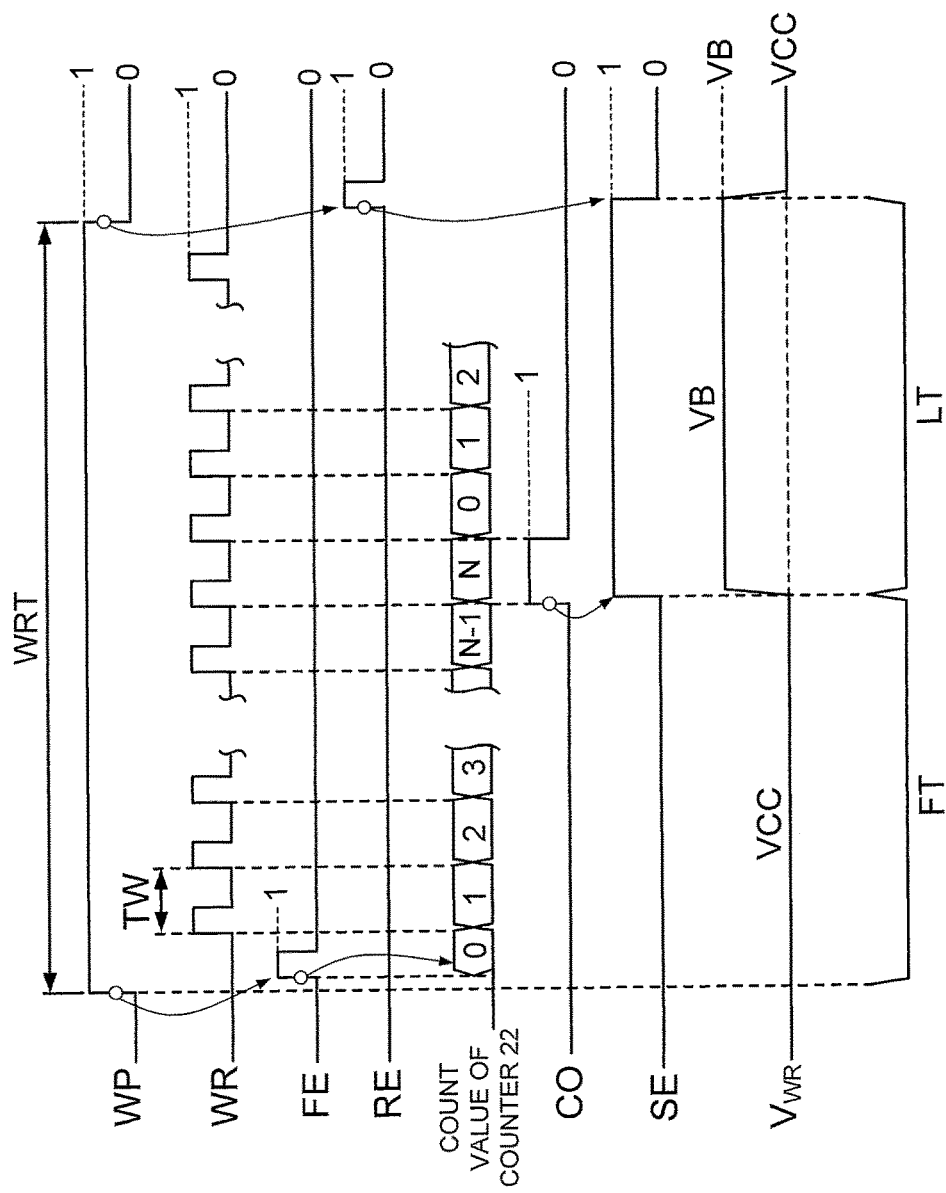
FIG. 2 is a time chart showing an example of an operation of a control unit 103 and the write voltage generation circuit 20.

By the verify write control, the column decoder 104 intermittently and repeatedly applies the write voltage $V_{WR}$ to each of the memory cells 10 via the bit lines BL in synchronization with the respective pulses of the write signal WR shown in FIG. 2. Each time the write voltage $V_{WR}$ is applied to each memory cell 10, a charge is injected into the memory cell 10. The charge is gradually accumulated. Here, the foregoing read control is performed so that the column decoder 104 supplies the read current value transmitted from the memory cell 10 to the control unit 103. The control unit 103 determines whether the read current value reaches a value corresponding to the write data. If the read current value reaches the value corresponding to the write data, the control unit 103 stops supplying the write signal WR to the column data 104 and the power supply unit 200.

The control unit 103 supplies a write period signal WP to the power supply unit 200. The write period signal WP is in a state of logic level 1 while the write voltage $V_{WR}$ is repeatedly applied to one address, i.e., during a write period WRT shown in FIG. 2. The write period signal WP is in a state of logic level 0 in the other periods.

The power supply unit 200 receives an external power supply voltage VCC supplied from an external power supply (not shown) via a power supply terminal 105, and generates an internal power supply voltage for operating the control unit 103 on the basis of the external power supply voltage VCC. The power supply unit 200 supplies the internal power supply voltage to the control unit 103. On the basis of the external power supply voltage VCC received via the power supply terminal 105, the power supply unit 200 also generates the foregoing selection voltage $V_{SL}$ which has a voltage value higher than that of the external power supply voltage VCC. The power supply unit 200 supplies the selection voltage $V_{SL}$ to the row decoder 102. On the basis of the external power supply voltage VCC received via the power supply terminal 105, the power supply unit 200 further generates the foregoing read voltage $V_{RD}$ which has a voltage value higher than that of the external power supply voltage VCC. The power supply unit 200 supplies the read voltage $V_{RD}$ to the column decoder 104.

The power supply unit 200 includes a write voltage generation circuit 20 which generates the foregoing write voltage $V_{WR}$ on the basis of the external power supply voltage VCC received via the power supply terminal 105.

Figure 3:
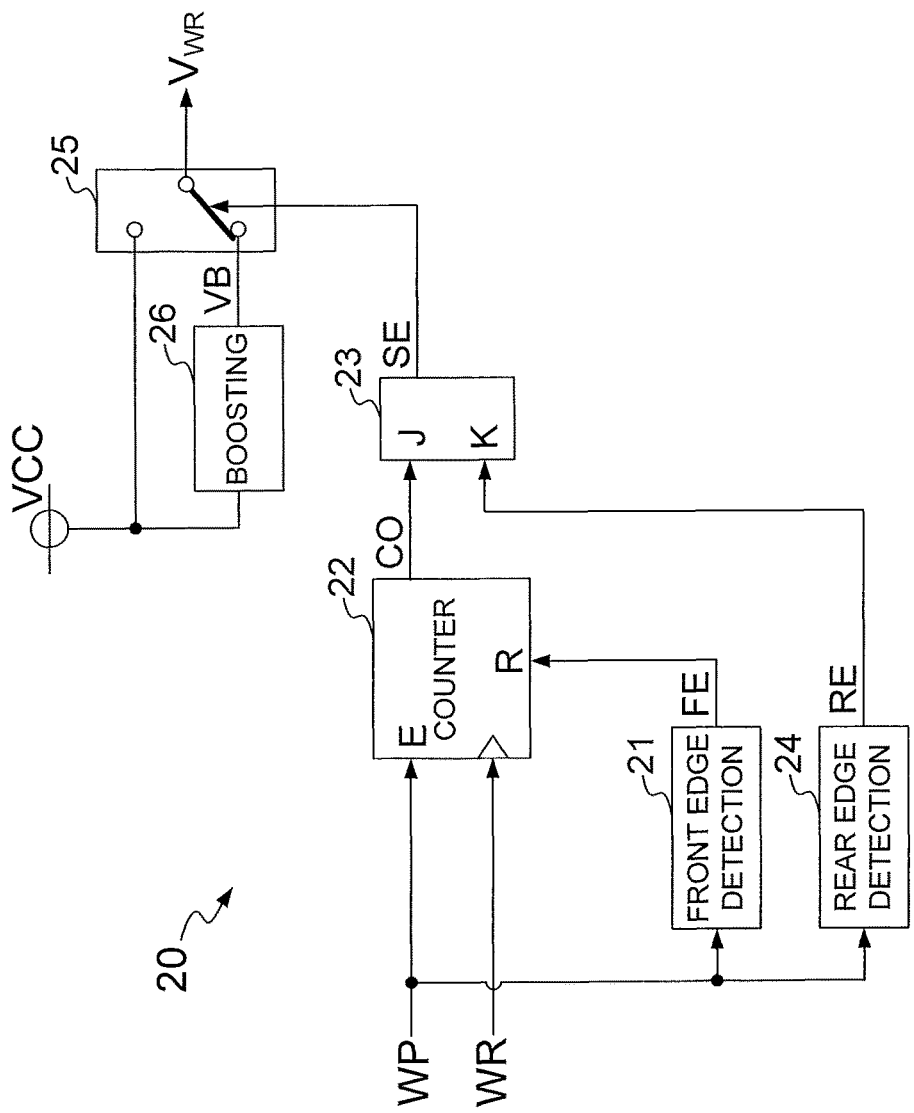
FIG. 3 is a circuit diagram showing an example of an internal configuration of the write voltage generation circuit 20.

FIG. 3 is a circuit diagram showing an example of an internal configuration of the write voltage generation circuit 20. In FIG. 3, a front edge detection circuit 21 generates a one-pulse front edge detection signal FE. As shown in FIG. 2, the front edge detection signal FE is in the state of logic level 1 for only a predetermined period if the leading portion of the write period WRT indicated by the write period signal WP is detected. The front edge detection circuit 21 supplies the front edge detection signal FE to a reset terminal R of a counter 22. The write signal WR is supplied to a clock terminal of the counter 22. The write period signal WP is supplied to an enable terminal E of the counter 22.

As shown in FIG. 2, the counter 22 initializes the current count value to zero according to the front edge detection signal FE of logic level 1. The counter 22 then counts the number of pulses of the write signal WR for a period when the write period signal WP is in the state of logic level 1, i.e., for the write period WRT. If the current count value reaches a maximum value N (N is an integer of 2 or more), the counter 22 supplies a carryout signal CO transitioning from the logic level 0 to the logic level 1 to a terminal J of a JK flip-flop 23 (hereinafter, referred to as JKFF 23).

A rear edge detection circuit 24 generates a one-pulse rear edge detection signal RE. As shown in FIG. 2, the rear edge detection signal RE is in the state of logic level 1 for only a predetermined period if the trailing portion of the write period WRT indicated by the write period signal WP is detected. The rear edge detection circuit 24 supplies the rear edge detection signal RE to a terminal K of the JKFF 23.

Immediately after power-on, the JKFF 23 generates and supplies a selection signal SE of logic level 0 to a selector 25. Then, as shown in FIG. 2, if the carryout signal CO of logic level 1 is supplied to the terminal J, the JKFF 23 is set to a set state and continues to supply the selection signal SE of logic level 1 to the selector 25. Subsequently, if the rear edge detection signal RE of logic level 1 is supplied to the terminal K, the JKFF 23 is set to a reset state and continues to supply the selection signal SE of logic level 0 to the selector 25.

A boosting circuit 26 includes, for example, a charge pump circuit or the like. The boosting circuit 26 boosts the external power supply voltage VCC to generate a boosted voltage VB. The boosted voltage VB is a voltage higher than the external power supply voltage VCC and has an optimum voltage value for a write voltage. The boosting circuit 26 supplies the boosted voltage VB to the selector 25.

The selector 25 selects either one of the boosted voltage VB and the external power supply voltage VCC which is designated by the selection signal SE. The selector 25 supplies the selected voltage to the column decoder 104 as the foregoing write voltage $V_{WR}$. More specifically, as shown in FIG. 2, while the selection signal SE is in the state of logic level 0, the selector 25 selects and supplies the external power supply voltage VCC to the column decoder 104 as the write voltage V. Here, the column decoder 104 intermittently and repeatedly applies the write voltage $V_{WR}$ having the same voltage value as that of the external power supply voltage VCC to each of the memory cells 10 via the bit lines BL in synchronization with the respective pulses of the write signal WR shown in FIG. 2.

On the other hand, while the selection signal SE is at the logic level 1, the selector 25 selects and supplies the boosted voltage VB to the column decoder 104 as the write voltage V. Here, the column decoder 104 intermittently and repeatedly applies the write voltage $V_{WR}$ having the same voltage value as that of the boosted voltage VB to each of the memory cells 10 via the bit lines BL in synchronization with the respective pulses of the write signal WR shown in FIG. 2.

With the foregoing configuration, the write voltage generation circuit 20 supplies the external power supply voltage VCC to the column decoder 104 as the write voltage $V_{WR}$ in a first part FT of the write period WRT shown in FIG. 2. Then, in a latter part LT of the write period WRT, the write voltage generation circuit 20 supplies the boosted voltage VB obtained by boosting the external power supply voltage VCC by the boosting circuit 26 to the column decoder 104 as the write voltage $V_{WR}$. As a result, in the first part FT of the write period WRT, the external power supply voltage VCC is applied to the memory cells 10 as the write voltage V. In the latter part LT of the write period WRT, the boosted voltage VB which is higher than the external power supply voltage VCC and has an appropriate voltage value for a write voltage is applied to the memory cells 10 as the write voltage V.

The smaller the amount of charge stored in a memory cell 10, the higher the amount of current (referred to as write current) that is transmitted to the memory cell 10 when the write voltage $V_{WR}$ is applied to the memory cell 10. In the first part FT of the write period WRT, the amount of charge stored in the memory cell 10 is smaller than that in the latter part LT of the write period WRT. The write current is thus higher. In other words, the write current is lower in the latter part LT of the write period WRT than that in the first part FT.

In the first part FL of the write period WRT, the write voltage generation circuit 20 thus supplies the external power supply voltage VCC, which is supplied from the external power supply capable of passing a relatively high current, to the column decoder 104 as the write voltage $V_{WR}$. The external power supply voltage VCC is a voltage lower than the appropriate voltage value for a write voltage. However, the external power supply can inject charges into the memory cells 10 by using a relatively high current, and can quickly accumulate charges into the memory cells 10. In the latter part LT of the write period WRT, the write voltage generation circuit 20 sets the boosted voltage VB, which is generated by the boosting circuit 26 and has an optimum voltage value for writing, as the write voltage $V_{WR}$ in place of the external power supply voltage VCC. At a point in time immediately before the latter part LT of the write period WRT, desired amounts of charge are stored in the memory cells 10 by the charge injection based on the foregoing external power supply voltage VCC. A boosting circuit of low current output type having low current supply capability can thus be employed as the boosting circuit 26. This reduces the chip occupation area of the boosting circuit 26.

With the write voltage generation circuit 20, data can thus be written at high speed without increasing the scale of the apparatus.

Figure 4:
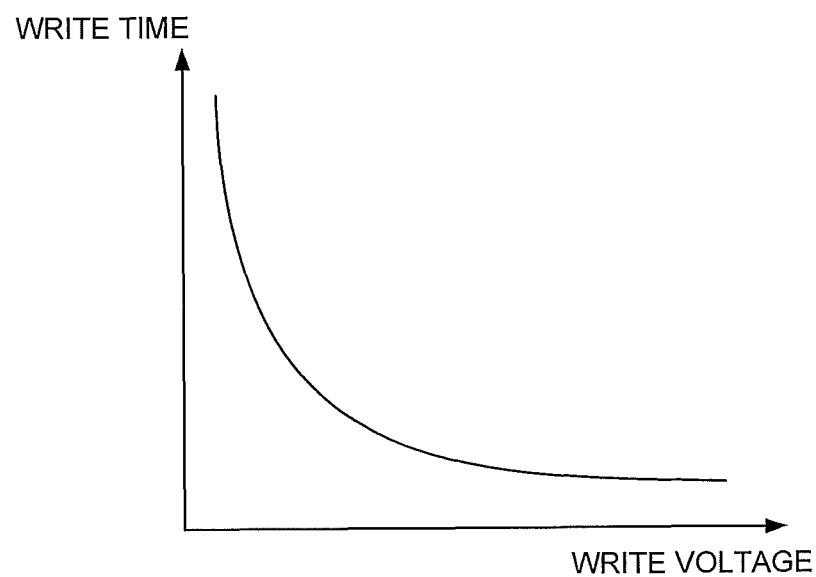
FIG. 4 is a chart showing the correspondence between a write voltage and write time.

The external power supply voltage VCC supplied from the external power supply does not need to have a fixed voltage value, and may have a voltage value within an allowable operation guaranteed range of the power supply unit 200. As shown in FIG. 4, the lower the voltage value of the write voltage $V_{WR}$, the longer the time needed for writing. If an external power supply voltage VCC having the minimum voltage value within the operation guaranteed range is supplied to the power supply voltage 200, a desired amount of charge may fail to be stored within the first part FT of the write period WRT.

Then, the duration of the first part FT may be changed according to the voltage value of the external power supply voltage VCC.

Figure 5:
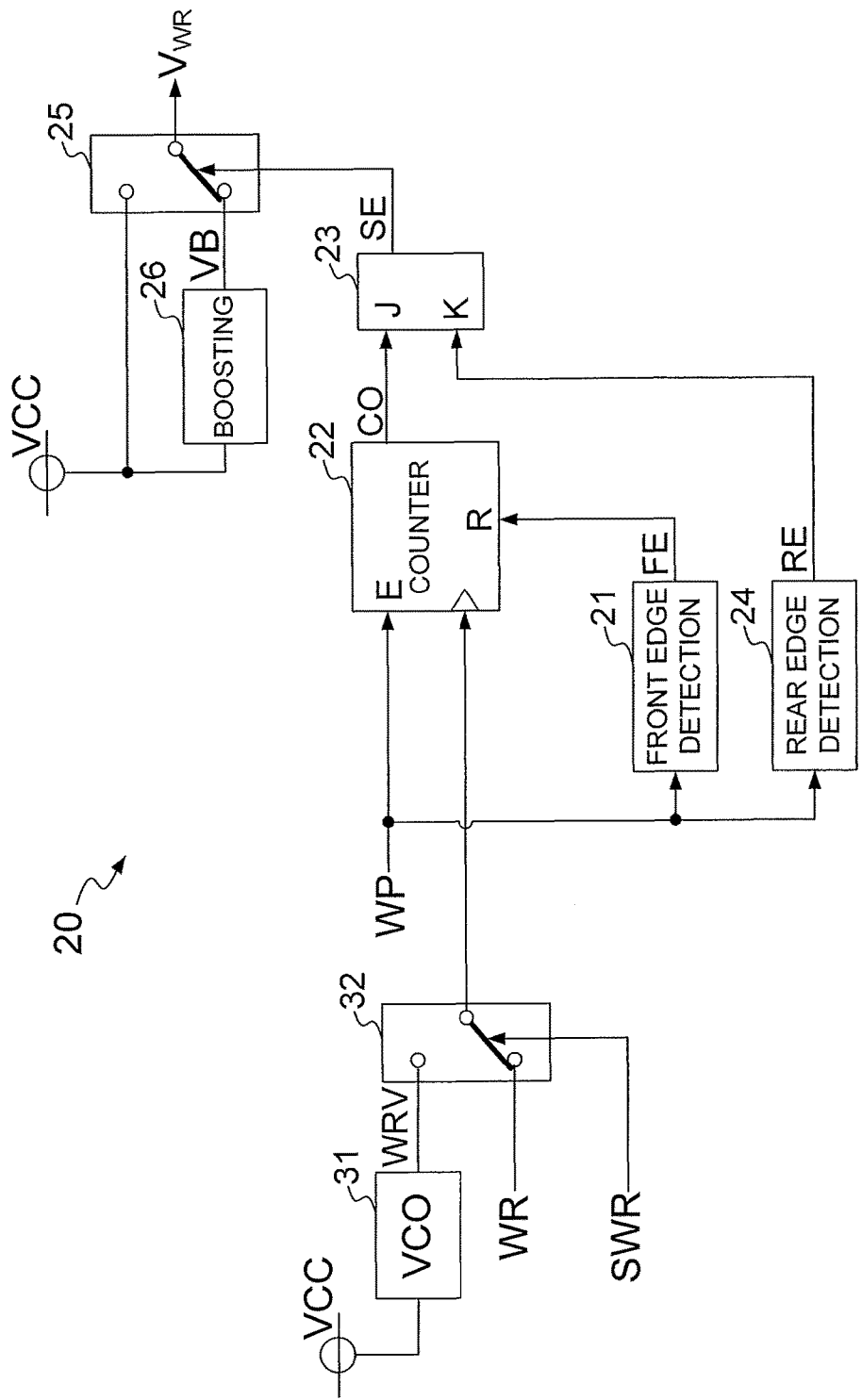
FIG. 5 is a circuit diagram showing another example of the internal configuration of the write voltage generation circuit 20.

FIG. 5 is a circuit diagram showing another example of the internal configuration of the write voltage generation circuit 20 that is achieved in view of the foregoing. The configuration of the write voltage generation circuit 20 shown in FIG. 5 is the same as that shown in FIG. 3 except that a VCO (Voltage Controlled Oscillator) 31 and a selector 32 are arranged in the preceding stage of the counter 22.

In FIG. 5, the VCO 31 generates a binary oscillation signal having a frequency corresponding to the voltage value of the external power supply voltage VCC. The VCO 31 supplies the oscillation signal to the selector 32 as a write signal WRV.

The selector 32 selects either one of the foregoing write signals WR and WRV that is designated by a selection signal SWR supplied from the control unit 103. The selector 32 supplies the selected write signal to the clock terminal of the counter 22. If the selection signal SWR designates the write signal WR, the write voltage generation circuit 20 having the configuration shown in FIG. 5 performs the same operation as that of the configuration shown in FIG. 3, i.e., the operation shown in FIG. 2.

If the selection signal SWR designates the write signal WRV, the write voltage generation circuit 20 basically performs the operation shown in FIG. 2. If the voltage value of the external power supply voltage VCC is low, the write voltage generation circuit 20 increases the pulse period TW of the write signal WR shown in FIG. 2 to increase the duration of the first part FT.

As a result, the amount of charges stored in the memory cell 10 can be brought up to the desired amount by immediately before the latter part LT of the write period WRT regardless of the voltage value of the external power supply voltage VCC.

In short, the write voltage generation circuit 20 may be any write voltage generation circuit as long as it can generate the write voltage ($V_{WR}$) to be applied to the memory cells (10) by using the boosting circuit (26) which boosts the external power supply voltage (VCC) received via the power supply terminal (105) to generate the boosted voltage (VB), and the selector (25). When selecting either one of the external power supply voltage received via the power supply terminal and the boosted voltage and outputting the selected voltage as the write voltage, the selector selects the external power supply voltage as the write voltage in the first part of the write period for writing data to the memory cells, and selects the boosted voltage as the write voltage in the latter part of the write period.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims.

This application is based upon and claims the benefit of priority from the prior Japanese Patent Application No. 2015-094334 filed on May 1, 2015, the entire contents of which are incorporated herein by reference.

What is claimed is:

1. A write voltage generation and application circuit for generating a write voltage and applying the write voltage to a memory cell thereby causing said memory cell to memorize data, the write voltage generation and application circuit comprising:
- a power supply terminal configured to receive an external power supply voltage;
- a boosting circuit configured to boost said external power supply voltage to generate a boosted supply voltage; and
- a selective relay circuit configured
  - to selectively relay said external power supply voltage as said write voltage to said memory cell so that a first charge is stored in said memory cell during a first part of a write period for writing data to said memory cell, and
  - to selectively relay said boosted supply voltage as said write voltage to said memory cell so that a second charge is stored in said memory cell during a latter part of said write period, the stored first charge being greater in amount than the stored second charge.

2. The write voltage generation circuit according to claim 1, comprising a counter configured to receive a write signal including a pulse series indicating timing to apply said write voltage to said memory cell in said write period, and to count the number of pulses in said write signal to obtain a count value, wherein
said selective relay circuit selectively relays said external power supply voltage to said memory cell between a start of said write period and when the count value reaches a predetermined number, and selectively relays said boosted supply voltage as said write voltage to said memory cell after the count value reaches the predetermined number.

3. The write voltage generation circuit according to claim 2, comprising a voltage controlled oscillator configured to generate an oscillation signal including a pulse series having a frequency corresponding to a voltage value of said external power supply voltage, the oscillation signal being generated as said write signal.

4. A memory apparatus for writing data by applying a write voltage to a memory cell thereby causing said memory cell to memorize data, the memory apparatus comprising:

- a power supply terminal configured to receive an external power supply voltage;
- a boosting circuit configured to boost said external power supply voltage to generate a boosted supply voltage; and
- a write driving unit configured
  - to apply said external power supply voltage as said write voltage to said memory cell so that a first charge is stored in said memory cell during a first part of a write period for writing data, and
  - to apply said boosted supply voltage as said write voltage to said memory cell so that a second charge is stored in said memory cell during a latter part of said write period, the stored first charge being greater in amount than the stored second charge.

5. The memory apparatus according to claim 4, wherein:
said write driving unit includes
- a decoder configured to apply said write voltage to said memory cell according to a write signal including a pulse series indicating timing to apply said write voltage to said memory cell in said write period, and
- a write voltage generation circuit configured to generate said write voltage; and said write voltage generation circuit includes
- a counter configured to count the number of pulses in said write signal in said write period to obtain a count value, and
- a selective relay circuit configured
  - to selectively relay said external power supply voltage as said write voltage to said memory cell between a start of said write period and when the count value reaches a predetermined number, and
  - to selectively relay said boosted supply voltage as said write voltage to said memory cell after the count value reaches the predetermined number.

6. The memory apparatus according to claim 5, comprising a voltage controlled oscillator configured to generate an oscillation signal including a pulse series having a frequency corresponding to a voltage value of said external power supply voltage, the oscillation signal being generated as said write signal.

* * * * *